(12) United States Patent
Lee et al.

(10) Patent No.: US 6,756,642 B2
(45) Date of Patent: Jun. 29, 2004

(54) INTEGRATED CIRCUIT HAVING IMPROVED ESD PROTECTION

(75) Inventors: Jian-Hsing Lee, Hsin-Chu (TW); Ta-Lee Yu, Hsin-Chu (TW); Shui-Hung Chen, Hsin-Chu (TW)

(73) Assignee: Taiwan SEmiconductor Manufacturing Co., Ltd, Hsin Chu (TW)

(*) Notice: Subject to any disclaimer, the term of this patent is extended or adjusted under 35 U.S.C. 154(b) by 0 days.

(21) Appl. No.: 10/291,053

(22) Filed: Nov. 7, 2002

(65) Prior Publication Data

US 2004/0089909 A1 May 13, 2004

(51) Int. Cl.[7] .............................................. H01L 23/62
(52) U.S. Cl. ............................................................ 257/355
(58) Field of Search ................................. 257/355, 356, 257/357, 358, 359, 360, 361, 362, 363, 364, 365, 154, 162, 167, 119, 122, 124, 133, 134, 168, 169, 173

(56) References Cited

U.S. PATENT DOCUMENTS 5,561,313 A * 10/1996 Saitoh et al. ................ 257/360
6,281,554 B1 * 8/2001 Pan ............................ 257/357
6,388,315 B1 * 5/2002 Clark et al. ................. 257/691

FOREIGN PATENT DOCUMENTS

JP           59007956 A  *  1/1984

* cited by examiner

Primary Examiner—Wael Fahmy
Assistant Examiner—Dana Farahani
(74) Attorney, Agent, or Firm—Tung & Associates

(57) ABSTRACT

In a high voltage n-channel MOS structure, inserting p+ diffusion and an n-well into NMOS drain area, along with providing ESD protection by means of forming parasitic SCR, allows using signal of 5V and decreases snapback voltage below 2V.

13 Claims, 2 Drawing Sheets

INTEGRATED CIRCUIT HAVING IMPROVED ESD PROTECTION

BACKGROUND OF THE INVENTION

1. Field of the Invention

The present invention relates generally to integrated circuits, more particularly to MOS buffer drivers, and even more specifically to such circuits protected from electrostatic discharge (ESD).

2. Description of the Related Art

Electrostatic discharge (ESD) is a phenomenon, wherein static build-up, such as produced by friction, is applied to an object. When the object is an integrated circuit (IC), portions of the device can be permanently damaged. Another major source of ESD exposure to ICs is from the human body. A charge can be induced on a body capacitance of 150 picofarads, leading to electrostatic potentials of 4 kV or greater. Contact with a charged human body by an uncharged or grounded IC pin can result in a discharge for about 100 ns with the currents of several amperes. Similar levels of ESD may be imposed on IC's from other sources such as metallic objects and the so-called charged device model (CDM) wherein the IC itself is charged and discharged to ground. Since ESD can involve pulses of thousands of volts, the damage can be surprisingly high.

The above actions usually destroy the IC. However, at lower ESD levels, PN junctions can be degraded so that leakage currents can increase to an unacceptable level. Accordingly, the ESD limits are related to acceptable performance levels. With respect to what can happen when damage occurs, several failure mechanisms can develop. The discharge energy can melt the silicon, into which the IC is fabricated. It can also rupture the silicon dioxide insulation. Here it is most likely that a metal oxide semiconductor (MOS) transistor gate oxide rupture will occur first because this oxide is the thinnest in the IC. Further, it can cause fusion of the interconnect metal or evaporate polysilicon conductors.

In testing the tolerance of an IC to ESD, it is common to charge a 150 pF capacitor to a controlled variable voltage (typically 1 to 2 kV) and then connect it through a 1.5 kΩ resistor to the various pins of the IC. The signal input/output pins are typically the most sensitive to damage from ESD. The capacitor charge is incremented until damage occurs and the level noted. The ESD resistance can then be rated in terms of the highest value of charge voltage that the IC can withstand without harm.

As the density of very large scale integrated circuits (VLSI) increases, the components of the circuits are becoming progressively smaller and more susceptible to damage from ESD. For example, the gate oxides of MOS transistors are becoming thinner and thinner, thus making oxide layer more susceptible for destruction caused by ESD. During an ESD event, charge is transferred between one or more pins of the IC and another conducting object in a time period that is typically less than one microsecond. This charge transfer can develop voltages that are large enough to break down insulating films (e.g., gate oxides) on the device, or can dissipate sufficient energy to cause electrothermal failures in the device. Such failures include contact spiking, silicon melting, or metal interconnect melting. It is especially important to protect gate oxide at input buffers and MOS components at bi-directional buffers and output drivers.

Therefore, the protection of ICs from ESD has received much attention from circuit designers. Workers in the field and inventors have proposed a lot of solutions, many trying to solve the problem of protecting sub-micron devices while still allowing them to function unencumbered and without undue, or zero, increase of silicon real estate. The resulting protection circuits may typically be connected to all Input/Output (I/O) pads of an integrated circuit (IC) to safely dissipate the energy associated with ESD events without causing any damage to the circuitry internal to the device. Protection circuits have also been connected to power supply pads, or between power supply buses to prevent such damage to internal circuits. In developing effective ESD protection circuitry, circuit designers may be limited with regard to the particular structures used, inasmuch as the protection circuit so designed must integrate well with the remainder of the integrated circuit. That is, the protection circuit must not interfere with meeting chip-level parameters.

One such parameter of interest is known as an input "leakage" current parameter. This parameter is particularly important where the input pins of the integrated circuit are subjected (either by design or accidentally) to voltages, which exceed the positive power supply voltage of the integrated circuit. For example, particular integrated circuits may be contemplated for use in a mixed-voltage environment, where the integrated circuit may operate at one voltage level (e.g., $V_{DD}$=3.3 volts), but must interface with another integrated circuit operating at a different, higher power supply voltage (e.g. 5.0 volts). As another example, the particular integrated circuit may be required to have a "hot-socket insertion" capability (i.e., the destination system is not powered down prior to insertion of the integrated circuit). In these "hot-socket" insertion situations, the time order of voltages applied to the various pins of the IC cannot be controlled.

Another solution to this problem, incorporating an on-chip ESD protection circuit on the input/output (I/O) pads of CMOS (complementary metal-oxide semiconductor) devices, comprises an ESD protection circuit connected to an input pad (IP). The circuit includes a field oxide device (FOD), an NMOS (N-type metal-oxide semiconductor) transistor, a resistor connected between them, and an inverter at the input of the circuit to be protected. The NMOS transistor is connected in such a manner that its gate is connected to the ground power line (thus referred to as a gate-grounded NMOS transistor) and is specifically designed to operate in the breakdown mode.

When an ESD stress appears at the IP, the resulting ESD current can bypass through the gate-grounded NMOS transistor to the ground power line. To allow the transistor to provide this ESD protection effect, the breakdown voltage of this transistor should be smaller than the breakdown voltage of the gate oxide layer in the inverter. The breakdown voltage of the gate-grounded NMOS transistor decreases as the channel length is shortened. However, a short channel length will make the transistor undesirably more vulnerable to ESD stress. The provision of the resistor can suppress the ESD current flowing through the gate-grounded NMOS transistor. Moreover, the FOD can help drain part of the ESD current from the IP to the ground power line. The FOD is preferably constructed on a non-lightly doped drain (LDD) structure, which allows it to be longer in channel length than the gate-grounded NMOS transistor so as to be capable of withstanding larger ESD currents.

A negative ESD voltage applied to the IP causes the gate-grounded NMOS transistor to produce a parasitic diode current. A positive ESD voltage applied to the IP causes the gate-grounded NMOS transistor to produce an NPN avalanche breakdown current, thus causing a large potential drop across the resistor. As a result of this, the FOD is switched to the conductive state. If the FOD is designed to be longer in channel length than the gate-grounded NMOS transistor, it will be also larger in breakdown voltage than the gate-grounded NMOS transistor. Therefore, the level of the breakdown voltage of the FOD can be close or even larger than that of the gate oxide layer in the inverter. If the IC device is further downsized, the gate oxide layer in the inverter will be correspondingly made thinner. As a result, the inverter would be subjected to a breakdown voltage before the NPN or PNP conduction takes place in the ESD protection circuit. The ESD protection circuit is therefore reduced in its ESD robustness to provide adequate ESD protection to the downsized IC device. Thus, as semiconductor fabrication technologies have advanced to the deep-submicron level, the conventional ESD protection circuit does not seem to be able to provide adequate ESD robustness.

This problem is dealt with in U.S. Pat. No. 6,337,787 issued to Tang. A gate-voltage controlled ESD protection circuit is designed to couple between an input port and an IC device having an inverter coupled to the internal circuit of the IC device for the purpose of protecting the IC device against ESD stress. The first potential drop sub-circuit is capable of allowing the PMOS transistor to be immediately switched into the conductive state in the event that a negative ESD voltage of a large magnitude is being applied to the input port. Similarly, the second potential drop sub-circuit is capable of allowing the NMOS transistor to be immediately switched into the conductive state in the event that a positive ESD voltage of a large magnitude is being applied to the input port. The characteristic structure of the ESD protection circuit can help the PMOS and NMOS transistors in the ESD protection circuit to provide the desired ESD protection without being affected by breakdown of the thin oxide layer in the inverter.

The task of designing ICs to maximize their tolerance to ESD is complicated by the fact that design modifications to make the circuit more tolerant to ESD cannot be at the sacrifice of circuit performance. Thus, ICs must be designed to tolerate industry standard levels of ESD, e.g. 2 kV without any reductions in specified levels of I/O driver currents.

Currently, one of the main thrusts of ESD protection for MOS devices is focused on the use of parasitic npn and pnp bipolar transistors, which together form a silicon controlled rectifier (SCR). While there has been some progress in the development of SCR-based structures in meeting state-of-the-art standards for protection against ESD events, such as the standards described by the well-known Human Body Model (HBM), fast ESD events, such as those described by the CDM, have uncovered weaknesses in at least some of the known SCR-based ESD protection structures. Unwanted as this SCR normally is, it can nevertheless safely discharge dangerous ESD voltages as long as its trigger voltage is low enough to protect those MOS devices, of which it is a part.

An example of using such SCR protecting device for protecting NMOS or Drain-Extended NMOS (DENMOS) is presented in U.S. Pat. No. 6,066,879 issued to Lee et al. and assigned to the assignee of this invention. In the patent, the SCR device and the NMOS or DENMOS transistors are integrated. The integration is made possible by adding a p+ diffusion to the n-well (drain) of a high power NMOS (DENMOS) transistor such that the added p+ diffusion together with the n-well and the p-substrate of the silicon wafer create one of the two transistors of the SCR. A low triggering voltage of the SCR is achieved by having the second parasitic npn transistor of the SCR in parallel with the NMOS (DENMOS) transistor by sharing the n-well (collector/drain), p-substrate (base/channel region), and an adjacent n+ diffusion (emitter/source) in the p-substrate. A high HBM ESD Passing Voltage is obtained by utilizing the tank oxide method of a DENMOS transistor.

Another example of using such SCR device for protecting NMOS is disclosed in U.S. Pat. No. 6,323,074 issued to Jiang et al. and also assigned to the assignee of this invention. In this patent, where the SCR protection device and the two NMOS transistors are also integrated, the two NMOS transistors share an n-type doped drain (ndd) area, which has implanted two n+ drains, one for each of the two transistors, and a p+ diffusion separates the two n+ drains. Furthermore, the ndd area has implanted an n-well, which extends from halfway under the first n+ drain to halfway under the second n+ drain. In addition, the depth of the n-well exceeds the depth of the ndd area. The added p+ diffusion together with the ndd area and the p-substrate of the silicon wafer create the parasitic pnp transistors of the SCR. The shared ndd area together with the n+ sources of the NMOS transistors creates the SCR's two parasitic npn transistors. The low triggering voltage of the SCR is achieved by the combination of the n-well, the ndd area, the p+ diffusion between the two drains, and by having the two parasitic npn transistors paralleled.

I/O drivers having multiple stages of driver circuits that are selectable to achieve a particular I/O current level present a unique problem of ESD protection. In those cases, wherein less than all of the total number of available stages is actually connected to achieve an output drive current, the remaining, unconnected stages are unused and are sometimes referred to as "dumnmy" output stages. Where an I/O driver possesses both active and dummy stages, an unbalanced or unsymmetrical load situation arises when the I/O buffer is subjected to ESD. The active stages are connected to ground and thus have gate oxide layers that break down at a slower speed and at a lower voltage. Conversely, the dummy stages are not connected to ground and their gate oxides break down more quickly and at higher voltage levels. As a result, an ESD current flowing through the IC is not evenly divided between the active and dummy stages. Consequently, the most susceptible section, i.e. the active stages, which have a lower breakdown voltage, determines the maximum ESD tolerance of the IC.

SUMMARY OF THE INVENTION

The principal object of the present invention is to provide a SCR structure for ESD protection purposes for an integrated circuit.

Another object of the present invention is to provide a SCR-based ESD-protected device with a SCR snapback voltage decreased below 2V.

Still another object of the present invention is to provide an ESD device for protecting NMOS transistors where NMOS transistors and SCR are integrated.

Yet another object of the present invention is to provide a SCR-based ESD-protected device that allows a 5V input signal.

In an electrostatic discharge protection device according to the present invention, the above objects are attained thanks to the fact that the device positioned between a bond pad and a reference potential comprises a first type of a substrate; a first and a second dopant implanted areas of a first type and a first, a second, and a third dopant implanted areas of a second type. The first dopant implanted area of the first type and the first, the second and the third dopant implanted areas of the second type are formed in the first type of the substrate, both the second dopant implanted area of the first type and the third dopant implanted area of the second type are connected to the reference potential, whereas the first dopant implanted area of the first type is connected to the bond pad. On top of the first type of the substrate, a first gate and a second gate are formed positioned between the first and the second dopant implanted areas of the second type and between the second and the third dopant implanted areas of the second type. There is also provided a well of a first type and a well of a second type, both wells being formed on the first type of the substrate, and the first dopant implanted area of the first type is formed on the well of the second type and extended to connect to both the first dopant implanted area of the second type and the bond pad representing an I/O terminal of the structure.

In a preferred embodiment of the present invention, the first type of the substrate includes a p-substrate, the dopant implanted areas of the first type include p+ diffusions, whereas the dopant implanted areas of the second type include n+ diffusions, the first and the second gate are connected to a first and a second voltage supply respectively. The above-identified objects are also attained by inserting a p+ diffusion and an n-well into NMOS drain area. With this in view, the first p+ diffusion, first gate, and second n+ diffusion represent a source, a gate, and a drain of a PMOS transistor, respectively; whereas the third n+ diffusion, the second gate, and the diffusion representing a source, a gate, and drain of a NMOS transistor, respectively. A parasitic silicon controlled rectifier comprises a parasitic pnp bipolar transistor having an emitter, a base, and a collector formed by the first p+ diffusion, n-well, and p-well, respectively; and a parasitic npn bipolar transistors having an emitter, a base, and a collector, the emitter, base, and collector of the parasitic npn bipolar transistor being formed by the third n+ diffusion, p-well, and n-well, respectively.

A first parasitic resistor created in the p-substrate extends between the second p+ diffusion and the base of the npn parasitic bipolar transistor. A second parasitic resistor created in the n-well extends between the base of the pnp parasitic bipolar transistor and the I/O pad.

The SCR has a snapback voltage preferably under 2 Volt.

Preferably, the first voltage supply is 5 Volt and the second voltage supply is 3.3 Volt.

A method of protecting a high voltage n-channel MOS transistor from ESD by a parasitic SCR according to the present invention provides for providing a semiconductor wafer with a p-substrate, forming n-well in the p-substrate, forming p-well on the p-substrate, implanting a first p+ diffusion in the n-well, implanting a second p+ diffusion in the p-substrate, implanting a first, a second, and a third n+ diffusions between p+ diffusions, forming a first gate between the n-well and the first n+ diffusion, forming a second gate between the first and second n-diffusions, connecting the first and second gates to voltage supply, and connecting the second p+ and the third n+ diffusions to a reference potential.

BRIEF DESCRIPTION OF THE DRAWINGS

The above objects and advantages of the present invention will become more apparent from an ensuing description of a preferred embodiment thereof with reference to the attached drawings, in which.

DETAILED DESCRIPTION OF THE PREFERRED EMBODIMENT

Figure 1:
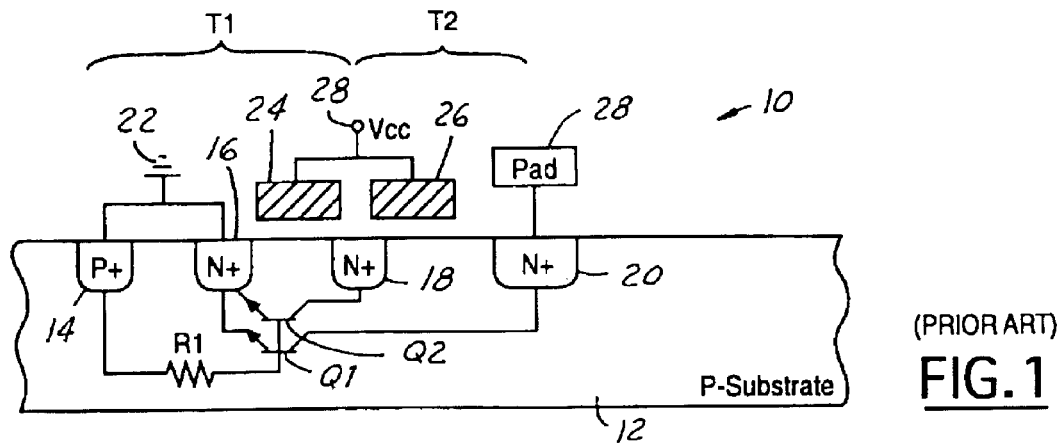
FIG. 1 is a schematic cross-sectional view of an NMOS device of the prior art.

Referring now to FIG. 1, a conventional semiconductor wafer 10 is shown with a p-substrate 12. Implanted in the p-substrate 12 are a p+ diffusion 14 and n+ diffusions 16, 18, and 20, the p+ diffusion 14 and the n+ diffusion 16 being connected to a reference potential 22, typically ground. A gate 24 and a polysilicon gate 26 are connected to a source 28 of voltage supply Vcc. A PMOS transistor TI is comprised of the p+ source 14, gate 24, and n+ drain 18. A NMOS transistor T2 is formed by same n+ drain 18, gate 26 and n+ source 20. A pad 28 is an I/O terminal of the structure. Emitters, bases and collectors of parasitic bipolar transistors Q1 and Q2 arc formed by the n+ diffusion 16, p-substrate 12, and n+ diffusions 18 and 20. Their bases are connected to the p+ region 14 via a parasitic resistor R1 symbolizing intrinsic resistance of the p-substrate 12.

Figure 2:
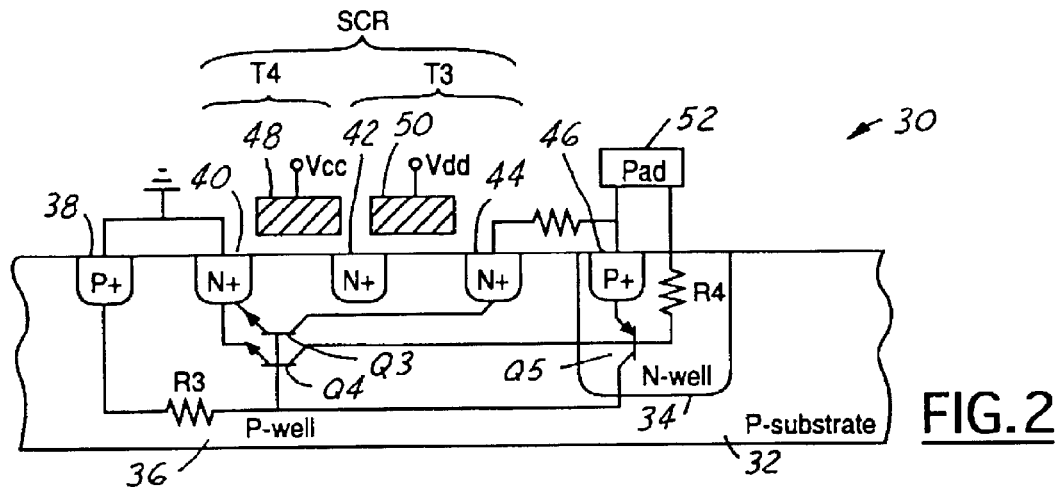
FIG. 2 is a schematic cross-sectional view of a high voltage NMOS device according to the present invention.

Shown in FIG. 2 is an ESD protection device structure in accordance with the present invention. The structure 30 placed at the input of an internal circuit (not shown) to be protected is formed on a p-substrate 32, which has p-well 34 and n-well 36. Implanted in the p-substrate 32 are p+ diffusion 38, n+ diffusions 40, 42, and 44, whereas a p+ diffusion 46 is implanted in the n-well 34. Gate 48 is connected to Vcc, and gate 50 is connected to voltage supply Vdd. A floating well PMOS T3 is formed by the p+ source 46, gate 50, and n+ drain 42, whereas a NMOS T4 is comprised of the n+ source 40, gate 48, and n+ drain 42. A pad 52 serves an I/O terminal of the structure with respect to external circuits (also not shown).

Emitters, bases and collectors of parasitic bipolar npn transistors Q3 and Q4 are formed by the n+ diffusion 40, swell 36, n+ diffusion 44, and n-well 34. A bipolar pnp parasitic transistor Q5 is formed by the p+ source 46, n-well 34 and p-well 36. The bases of transistors Q3 and Q4 are connected to the p+ region 38 via a parasitic resistor R3 symbolizing intrinsic resistance of the p-substrate 32. A resistor R4, by which the base of the pnp bipolar parasitic transistor Q5 is connected to the I/O pad 52, represents intrinsic resistance of the n-well 34. The transistors Q4 and Q5 form a SCR. Connected in parallel with the transistors T3, T4 and between voltage supply and reference (ground) potential, SCR protects the transistors T3, T4. Also, as the gate of the PMOS transistor T3 is connected to Vdd and the gate of the NMOS transistor T4 is connected to the reference potential (for dummy stages) or to pre-driver (for active stages), the structure allows using 5V input signals when employing 3.3V NMOS transistors.

Figure 3:
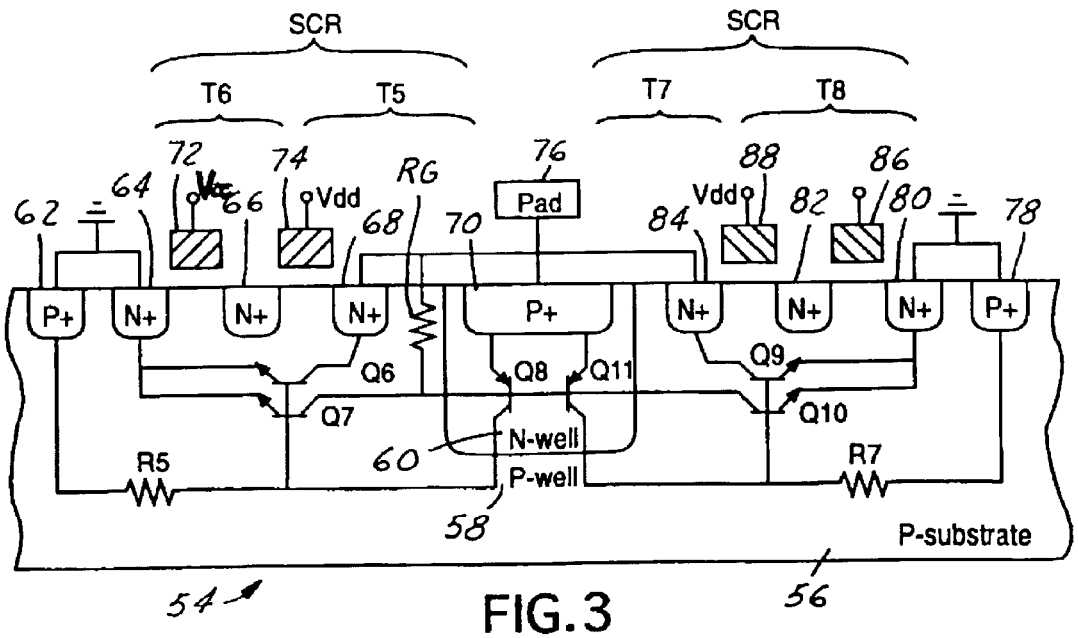
FIG. 3 is a schematic cross-sectional view of a high voltage robust NMOS transistors with parasitic SCRs according to the present invention.

The structure of FIG. 2 can be repeated as many times as necessary, the limit depending on the current capacity desired. FIG. 3 shows the structure of FIG. 2 arranged in a mirror fashion. The structure 54 placed at the input of an internal circuit (not shown) to be protected is formed on a p-substrate 56, which has p-well 58 and n-well 60. Implanted in the p-substrate 56 are a p+ diffusion 62, n+ diffusions 64, 66, and 68, whereas a p+ diffusion 70 is implanted in the n-well 60. Gate 72 is connected to Vcc, and gate 74 is connected to voltage supply Vdd. A floating well PMOS T5 is formed by the p+ source 70, gate 74, and n+ drain 66, whereas a NMOS T6 is comprised of the n+ source 64, gate 72, and n+ drain 66. A pad 76 serves an I/O terminal of the structure with respect to external circuits (also not shown).

Emitters, bases and collectors of parasitic bipolar npn transistors Q6 and Q7 are formed by the n+ diffusion 64, p-well 58, n+ diffusion 68, and n-well 60. A bipolar pnp parasitic transistor Q8 is formed by the p+ source 70, n-well 60 and p-well 58. The bases of transistors Q6 and Q7 are connected to the p+ region 62 via a parasitic resistor R5 representing intrinsic resistance of the p-substrate 56. A resistor R6, by which the base of the pnp bipolar parasitic transistor Q8 is connected to the I/O pad 76, represents intrinsic resistance of the n-well 60. The transistors Q7 and Q8 form a SCR.

A mirror configuration includes a p+ diffusion 78, n+ diffusions 80, 82 and 84, and gate regions 86 and 88. Also shown in FIG. 3 are parasitic transistors Q9–Q11 mirroring the transistors Q6–Q8. The transistors Q19 and Q11 form another SCR.

In an ESD event, the protection the NMOS/PMOS transistors by the SCR is achieved by the following mechanism: as the voltage goes up, the p-well (36 and 58 in FIGS. 2, 3, respectively) serving the gate for the npn parasitic transistor (Q4, Q7, Q10) breaks down and turns on the npn transistor of the SCR. A current flows into the p-well and turns on the pnp transistor (Q5, Q8, Q11). The SCR fires and short-circuit the current of the ESD from voltage supply to reference potential (typically ground). First transistor (T4, T6, T8) paralleled with SCR helps reduce the snapback voltage. The snapback breakdown effect during ESD on the drain of the first transistor triggers the SCR into conduction and lowers the trigger voltage for the SCR below 2V.

Figure 4:
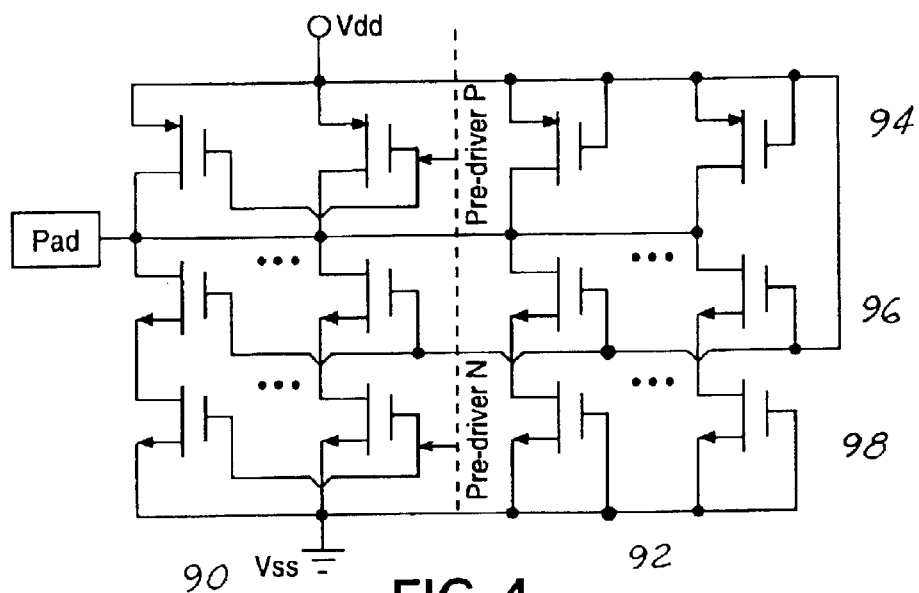
FIG. 4 is an illustration of realizing the present invention in a I/O driver with multiple stages of driver circuits.

FIG. 4 is an illustration of implementing the present invention in I/O drivers having multiple stages of driver circuits that are selectable to achieve a particular I/O current level. Shown are cascades 90 of active (used) I/O and cascades 92 of dummy (unused) I/O. In line 94, the structure has floating well PMOS transistors (in active and dummy stages), with sources in active stages connected to Vdd, gates of active stages connected to Vcc from pre-driver P circuit, and gates of dummy stages connected to Vdd. In line 96, gates of all the stages are connected to Vdd, whereas in line 98 gates of active stages are connected to Vcc from pre-driver N circuit and gates from dummy stages are connected to reference potential Vss.

Figure 5:
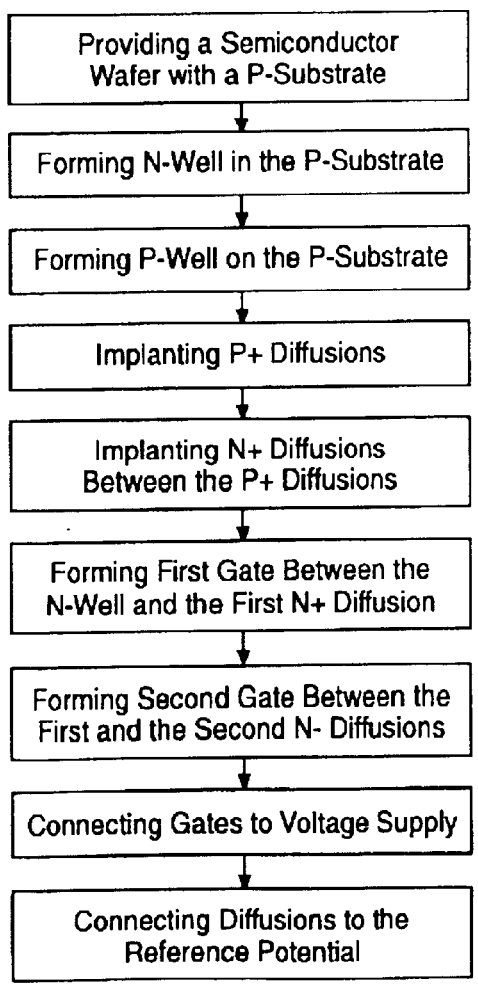
FIG. 5 is a block diagram of the method of the present invention.

Shown in FIG. 5 is a graphic illustration of the method of the present invention. Block/step 100 illustrates providing a semiconductor wafer with a p-substrate. Block 102 describes forming n-well in the p-substrate. Block 104 depicts forming p-well on the p-substrate. Block 106 shows implanting p+ diffusions, whereas block 108 illustrates implanting n+ diffusions between the p+ diffusions. Block 110 illustrates forming gates, namely, forming first gate between the n-well and the first n+ diffusion, and forming second gate between the first and the second n-diffusions. Block 112 is about connecting gates to voltage supply, and block 114 symbolizes connecting diffusions to the reference potential.

It is to be understood that the embodiments of the present invention that have been disclosed herein above are given by example only and not in a limiting sense. Those skilled in the art may make various modifications and additions to the preferred embodiments chosen to illustrate the invention without departing from the spirit and scope of the present contribution to the art. Specifically, it is believed that principles of the present invention are easily applicable to various structures employing CMOS. Accordingly, it is to be realized that the patent protection sought and to be afforded hereby shall be deemed to extend to the subject matter claimed and all equivalence thereof fairly within the scope of the invention.

What is claimed is:

1. An electrostatic discharge protection device, comprising:
    a first type of a substrate;
    a first and a second dopant implanted areas of a first type,
    a first, a second, and a third dopant implanted areas of a second type,
    said first dopant implanted area of said first type and said first, said second and said third dopant implanted area of said second type being formed in said first type of said substrate,
    both said second dopant implanted area of said first type and said third dopant implanted area of said second type being connected to a reference potential,
    said first dopant implanted area of said first type being connected to a bond pad,
    a first gate and a second gate formed on top of said first type of said substrate and positioned between said first and said second dopant implanted areas of said second type and between said second and said third dopant implanted areas of said second type,
    a well of a first type and a well of a second type, both said wells being formed on said first type of said substrate, said first dopant implanted area of said first type being formed on said well of said second type and extended to connect to both said first dopant implanted area of said second type and said bond pad representing an I/O terminal of said structure.

2. The electrostatic discharge protection device as claimed in claim 1, wherein
    said first type of said substrate includes a p-substrate,
    said dopant implanted areas of said first type include p+ diffusions,
    said dopant implanted areas of said second type include n+ diffusions,
    said first and said second gate are connected to a first and a second voltage supply, respectively,
    said first p+ diffusion, said first gate, and said second n+ diffusion representing a source, a gate, and a drain of a PMOS transistor, respectively;
    said third n+ diffusion, said second gate, and said second n+ diffusion representing a source, a gate, and drain of a NMOS transistor, respectively, and
    a parasitic silicon controlled rectifier further comprising:
        a parasitic pnp bipolar transistor having an emitter, a base, and a collector, said emitter, said base, and said collector of said parasitic pnp bipolar transistor being formed by said first p+ diffusion, said n-well, and said p-well, respectively; and
        a parasitic npn bipolar transistors having an emitter, a base, and a collector, said emitter, said base, and said collector of said parasitic npn bipolar transistor being formed by said third n+ diffusion, said p-well, and said n-well, respectively.

3. The electrostatic discharge protection device according to claim 2, wherein said first, said second, and said third n+ diffusions are located between said first p+ and said second p+ diffusions.

4. The electrostatic discharge protection device according to claim 2, wherein a first parasitic resistor is created in said p-substrate, said first parasitic resistor extending between said second p+ diffusion and said base of said npn parasitic bipolar transistor.

5. The electrostatic discharge protection device according to claim 2, wherein a second parasitic resistor is created in said n-well, said second parasitic resistor extending between said base of said pnp parasitic bipolar transistor and said I/O pad.

6. The electrostatic discharge protection device according to claim 2, wherein said SCR has a snapback voltage under 2 Volt.

7. The electrostatic discharge protection device according to claim 2, wherein said first voltage supply is 5 Volt.

8. The electrostatic discharge protection device according to claim 2, wherein said second voltage supply is 3.3 Volt.

9. An electrostatic discharge protection device, comprising:
   a semiconductor wafer with p-substrate,
   a n-well formed in said p-substrate,
   a p-well formed in said p-substrate,
   a first p+ diffusion implanted in said n-well,
   a first, a second, and a third n+ diffusion implanted in said p-substrate,
   a second p+ diffusion implanted in said p-substrate,
   a first gate formed between said first and said second n+ diffusions,
   a second gate formed between said second and said third diffusions,
   a pad connected to said first p+ diffusion and representing an I/O terminal of said structure,
   said first gate being connected to a first voltage supply,
   said second gate being connected to a second voltage supply,
   said second p+ diffusion and said third n+ diffusion being connected to a reference potential,
   said first p+ diffusion, said first gate, and said second n+ diffusion representing a source, a gate, and a drain of a PMOS transistor, respectively;
   said third n+ diffusion, said second gate, and said second n+ diffusion representing a source, a gate, and drain of a NMOS transistor, respectively, and
   a parasitic silicon controlled rectifier further comprising:
     a parasitic pnp bipolar transistor having an emitter, a base, and a collector, said emitter, said base, and said collector of said parasitic pnp bipolar transistor being formed by said first p+ diffusion, said n-well, and said p-well, respectively;
     a parasitic npn bipolar transistors having an emitter, a base, and a collector, said emitter, said base, and said collector of said parasitic npn bipolar transistor being formed by said third n+ diffusion, said p-well, and said n-well, respectively;
     a first parasitic resistor created in said p-substrate, said first parasitic resistor extending between said second p+ diffusion and said base of said npn parasitic bipolar transistor; and
     a second parasitic resistor created in said n-well, said second parasitic resistor extending between said base of said pnp parasitic bipolar transistor and said I/O pad.

10. The electrostatic discharge protection device according to claim 9, wherein said first, said second, and said third n+ diffusion are located between said first p+ and said second p+ diffusions.

11. The electrostatic discharge protection device according to claim 9, wherein said SCR has a snapback voltage under 2 Volt.

12. The electrostatic discharge protection device according to claim 9, wherein said first, voltage supply to 5 Volt.

13. The electrostatic discharge protection device according to claim 9, wherein said second voltage supply is 3.3 Volt.

* * * * *